United States Patent [19]
Hayashi et al.

[11] Patent Number: 5,581,109
[45] Date of Patent: Dec. 3, 1996

[54] SEMICONDUCTOR DEVICE

[75] Inventors: Kuniyuki Hayashi; Masaya Kitagawa; Tetsu Tanizawa, all of Kawasaki, Japan

[73] Assignee: Fujitsu Limited, Kawasaki, Japan

[21] Appl. No.: 392,159

[22] Filed: Feb. 22, 1995

[30] Foreign Application Priority Data

Mar. 18, 1994 [JP] Japan .................... 6-049580

[51] Int. Cl.⁶ .................................. H01L 29/00
[52] U.S. Cl. .................. 257/503; 257/618; 257/773; 257/776; 257/786; 257/909
[58] Field of Search .................... 257/503, 618, 257/773, 776, 786, 909

[56] References Cited

U.S. PATENT DOCUMENTS 5,162,893  11/1992  Okano ..................... 257/786
5,436,485   7/1995  Shikatani et al. ......... 257/909

*Primary Examiner*—Edward Wojciechowicz
*Attorney, Agent, or Firm*—Nikaido, Marmelstein, Murray & Oram LLP

[57] ABSTRACT

A semiconductor device includes a semiconductor chip, an I/O-cell circuit having a transistor-array part. The semiconductor device further includes a first group of bonding pads and a second group of bonding pads. The first group of bonding pads is connected with the I/O-cell circuit and is formed in a first pad-forming area arranged along an outer side of the transistor-array part in the I/O-cell circuit. And the second group of bonding pads is connected with the I/O-cell circuit and is formed in a second pad-forming area along an inner side of the transistor-array part in the I/O-cell circuit.

7 Claims, 10 Drawing Sheets

FIG. 8
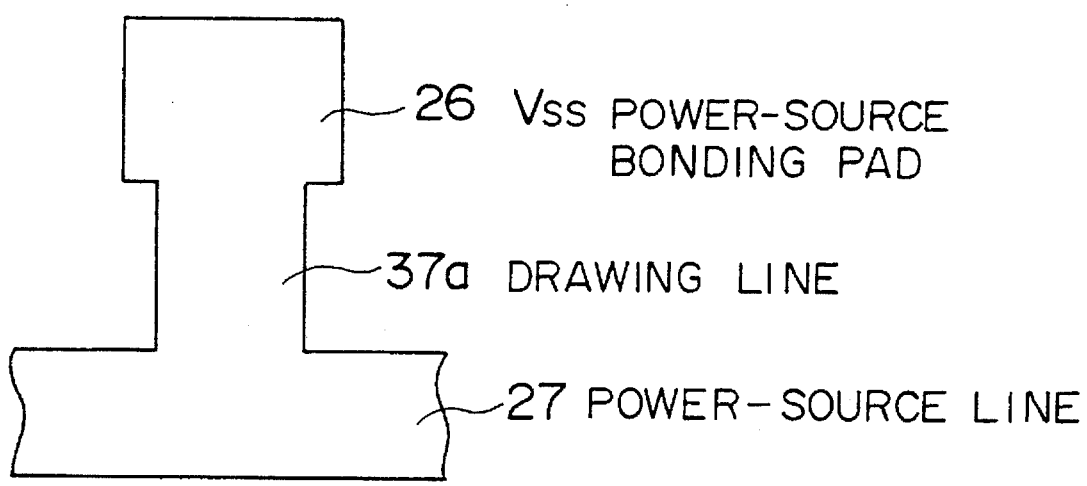
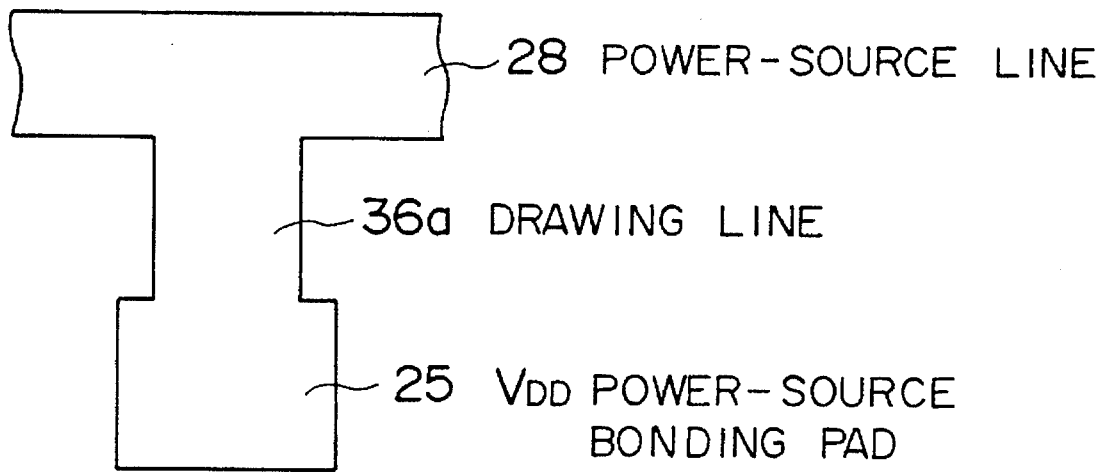

SEMICONDUCTOR DEVICE

BACKGROUND OF THE INVENTION

1. Field of the Invention

The present invention generally relates to a semiconductor device, and more particularly, to a semiconductor device in which an I/O circuit is formed on a semiconductor chip.

2. Description of the Prior Art

In recent electronic devices, downsizing such as miniaturization and weight reduction are rapidly being performed. To achieve this downsizing, a semiconductor device, which is a component of the electronic devices, is also miniaturized and is integrated to a high density.

With respect to, for example, a microprocessor as the semiconductor device, the microprocessor is constructed such that logic circuits, memory circuits, and input and output (I/O) circuits, etc., are installed on a semiconductor chip.

Therefore, to miniaturize the semiconductor device, there is a need for an efficient layout of such circuits on the semiconductor chip.

FIG. 1 shows an overall configuration of a conventional semiconductor device, and FIG. 2 shows a schematic configuration of areas (I/O circuit area) where I/O circuits of the conventional semiconductor device are installed.

A semiconductor device 1 shown in FIG. 1 may be, for example, the microprocessor. This semiconductor device 1 is constructed such that a logic circuit 2, a memory circuit 3, and an I/O circuit 4, etc., are installed on a semiconductor chip 5. As shown in FIG. 2, the I/O circuit 4 is constructed such that I/O cell circuits 6 for an input and an output, bonding pads 7 for input and output ports, power-source lines $V_{DD}$, $V_{SS}$, etc., are formed on the semiconductor chip 5.

The I/O circuit 4 is formed near sides of the semiconductor device 1, and the logic circuit 2 and the memory circuit 3 are arranged to be surrounded by this I/O circuit 4. The I/O cell circuits 6 constructing the I/O circuit 4 process to input and to output several signals to/from the logic circuit 2 and the memory circuit 3. The bonding pads 7 are wire-connected with leads 8, and are for coupling with external circuits, which are to be connected to the semiconductor chip 1, via wires and the leads 8. Further, the power-source lines $V_{DD}$, $V_{SS}$ supply a power source to the I/O cell circuits 6, and are arranged, for example, in a form of rings in the I/O circuit area 4 of FIG. 1.

In such a conventional device, a plurality of the I/O cells 6 are arranged according to a number of routing lines which are routed to/from the logic circuits 2 and the memory circuits 3. And a number of bonding pads 7 corresponds to a number of the I/O cell circuits 6 and the power-source lines $V_{DD}$, $V_{SS}$. In other words, for one I/O cell circuit 6, an associated bonding pad 7 is formed to be connected with the I/O cell circuit 6. Further, the bonding pads 7 include power-source pads 7a and 7b, which may be connected with the power-source lines $V_{DD}$, $V_{SS}$, respectively. And the bonding pads 7 are arranged outside the I/O cell circuits 6.

However, in such a conventional configuration, such that the plurality of the bonding pads 7 are arranged in a single line only outside the I/O cell circuits 6, when the number of the bonding pads 7 are increased according to an increase of a number of pins due to a high-density integration of the semiconductor device 1, a large area for forming such a large number of bonding pads is necessary outside the I/O cell circuits 6. There is thus a problem of a size-increasing of the semiconductor device 1.

As one means to solve this problem, a configuration as shown in FIG. 3 is known. FIG. 3 shows a modified configuration of the I/O cell circuits 6 and the bonding pads 7, where the bonding pads 7 are arranged in a plural number of lines outside the I/O cell circuits 6. In FIG. 3, for example, the bonding pads 7 are arranged in a form of 4 lines.

However, in this configuration, an interval length between drawing lines 11 which are lead from the bonding pads 7 to the I/O cell circuits 6 becomes narrow, so that there is a problem that fine drawing lines 11 have to be formed.

When the drawing lines 11 are finely structured, impedance performance is degraded and parasitic capacitances are generated. These results lead to a degradation of signal transmission performance. Further, in drawing lines 11 which are connected with the power-source pads 7a and 7b, a large voltage reduction occurs, so that there are also problems of an increase in power consumption and a danger of circuit trouble.

FIG. 4 shows a conventional connecting configuration between the power-source pads 7a, 7b and the power-source lines $V_{DD}$, $V_{SS}$. As shown in FIG. 4, the power-source pads 7a, 7b are arranged in the single line outside the I/O cell circuits. In this case, though the power-source pad 7a may be directly connected with the power-source line $V_{SS}$, the power-source pad 7b has to be connected with the power-source line $V_{DD}$ over the power-source line $V_{SS}$.

To achieve this connection, in a prior art, first a conductive line 12 with vias 14, 15 is formed over the power-source line $V_{SS}$ on which an insulating film is previously formed, next, the power-source pad 7b and the power-source line $V_{DD}$ are connected to the conductive line 12 through the vias 15, 14, so that a pass between the power-source pad 7b and the power-source line $V_{DD}$ becomes conductive.

However, in such a connecting configuration, electrical resistances in the vias 14, 15 are large, whereby large voltage reductions occur in the vias 14, 15, so that there are also problems of the increase of power consumption and the danger of circuit trouble.

Furthermore, in the conventional semiconductor device 1, the I/O cell circuit 6 occupies a large-size area, and this also makes the semiconductor device large. A description of the reason for this will be given as follows.

As shown in FIG. 2, the I/O cell circuit 6 comprises a transistor part 9 in which a large number of transistors are integrated, and an I/O controller part 10. In the I/O cell circuit 6, the transistor part 9 occupies a larger area than that of the I/O controller part 10. The reason for this is as follows. An area of the transistor part 9 is associated with a number of the transistors to be formed in the chip, and the number of the transistors is based on an amount of a driving current for an input-and-output processing. And to evaluate performance of the transistor part 9, a maximum value of the driving current which may be expected is generally referenced. Therefore, a size of the transistor part 9 is increased.

And in the conventional device, each I/O cell circuit 6 is constructed in the same configuration, thus each configuration of the transistor parts 9 is also the same. Therefore, a plurality of large-sized I/O cell circuits 6 are installed on the semiconductor chip 5, so that this also leads to a size-increasing of the semiconductor device 1.

Further, as mentioned above, the transistor part 9 is evaluated by referring to the maximum value of the driving current which may be expected. However, in the plurality of I/O cell circuits 6, there are some circuits in which the input-and-output processing of the signals may be performed by a smaller driving current than the referenced maximum value. In such I/O cell circuits, several transistors of the transistor part 9 are not utilized for the input-and-output processing. Therefore, an area occupied by unutilized transistors may be a useless space producing an inefficient integration of the semiconductor device.

SUMMARY OF THE INVENTION

It is an object of this invention to provide a semiconductor device which can be efficiently integrated to a small size, in which the disadvantages described above are eliminated.

A more specific object of the present invention is to provide a semiconductor device which can be operative without danger of any troubles and with a low power consumption.

The object described above is achieved by a semiconductor device comprising: a semiconductor chip; an I/O-cell circuit including a transistor-array part; a first group of bonding pads which is connected with the I/O-cell circuit and is formed in a first pad-forming area arranged along an outer side of the transistor-array part in the I/O-cell circuit; and a second group of bonding pads which is connected with the I/O-cell circuit and is formed in a second pad-forming area along an inner side of the transistor-array part in the I/O-cell circuit.

The object described above is also achieved by the semiconductor device mentioned above, wherein the I/O-cell circuit further includes a controller part which is separated from the transistor-array part on the semiconductor chip.

The object described above is further achieved by the semiconductor device mentioned above, wherein the semiconductor device further comprises: first power-source lines for supplying a first power source to the transistor-array part; and second power-source lines for supplying a second power source to the controller part; wherein the first power-source lines and the second power-source lines are independently arranged.

In addition, the object described above is achieved by the semiconductor device mentioned above, wherein the transistor-array part is allocated into a plurality of areas based on a necessary value of a driving current for driving an input/output signal.

The object described above is further achieved by the semiconductor device mentioned above, wherein the transistor-array part is allocated into the plurality of areas by means of generating isolation between the areas by turning off transistors in a boundary of the area.

The object described above is further achieved by the semiconductor device mentioned above, wherein the semiconductor device further comprises two power-source lines which are formed on the transistor-array part along a direction of lines formed by the first or the second group of bonding pads, each of the two power-source lines being connected with a power-source bonding pad of the bonding pads close to its power-source line.

The object described above is further achieved by the semiconductor device mentioned above, wherein a portion of the power-source line is located further towards the inside of the semiconductor chip than the second group of bonding pads which are located along the inner side of the transistor-array part.

According to the semiconductor device of the present invention, the first group of the bonding pads is formed in the first pad-forming area arranged along the outer side of the transistor-array part, and the second group of the bonding pads is formed in the second pad-forming area along the inner side of the transistor-array part. Therefore, the bonding pads are arranged in a form of 2 lines on opposite sides of the transistor-array part.

Thus, drawing lines between the transistor-array part and the bonding pads may be routed with a sufficient flexibility, so that the transistor-array part can be connected with the bonding pads by using shorter and thicker routing lines as the drawing lines. A size of the semiconductor device may be reduced by an amount of shortening of the drawing lines. And the shorter and thicker drawing lines enable impedance of the routing lines between the transistor-array part and the bonding pads to be decreased, and can prevent generation of loss in a signal transmission and a power supply.

And according to the semiconductor device according to the present invention, the transistor-array part is separated from the controller part on the semiconductor chip. Therefore, an individual design of the transistor-array part and the controller part is allowed, and this enables an efficient layout for forming these parts. Thus, an unused space on the semiconductor chip may be reduced, and this advantage leads to miniaturization of the semiconductor device.

Further according to the semiconductor device, the second power-source lines for supplying the power source to the controller part is installed on the controller part, and the first power-source lines for supplying the power source to the transistor-array part and the second power-source lines are independently arranged. Therefore, there is no need for routing lines from the single power-source line to the transistor-array part and the controller part. This configuration also enables an efficient layout for forming the power-source lines. Thus the unused space on the semiconductor chip may be reduced, and this advantage also leads to the miniaturization of the semiconductor device.

And according to the semiconductor device of the present invention, the transistor-array part is allocated into the plurality of areas based on the necessary value of the driving current for driving the input/output signal. While, in the conventional configuration, the same I/O-cell circuit has been formed for each bonding pad, so as to be adaptive to a maximum value of the driving current. Therefore, the new configuration according to the present invention may extremely reduce useless transistors, and enables the transistor-array part to be a small size. Such a small-sized transistor-array part also enables the miniaturization of the semiconductor device.

And according to the semiconductor device, the transistor-array part is allocated into the plurality of areas by means of generating isolation between the areas by turning off transistors in the boundary of the area. In other words, the transistor-array part can be easily allocated into the plurality of the areas with no specific configuration, but only by electrically switching the transistors.

Further, according to the semiconductor device, two power-source lines are formed on the transistor-array part along the direction of the lines formed by the bonding pads, each of the two power-source lines being connected with the power-source bonding pad close to its power-source line. Therefore, the power-source line can be connected with the power-source bonding pad without crossing the other power-source line, so that this may prevent impedance in the connection part between the power-source line and the power-source bonding pad from increasing, and may also prevent generation of loss in the power-source supply.

And according to the semiconductor device, the portion of the power-source line is located further towards the inside of the semiconductor chip than the second group of bonding pads which are located along the inner side of the transistor-array part. In this configuration, power-source bonding pads on the semiconductor chip can be connected to the power-source lines with shorter lines without vias. This configuration may also prevent the impedance in the connection part between the power-source line and the bonding pad from increasing, and the loss of the power-source supply may be reduced.

Other objects and further features of the present invention will be apparent from the following detailed description when read in conjunction with the accompanying drawings.

BRIEF DESCRIPTION OF THE DRAWINGS

FIG. 8 shows an extended illustration of a connecting configuration between power-source-bonding pads and the power-source lines;

DESCRIPTION OF THE PREFERRED EMBODIMENTS

Figure 5:
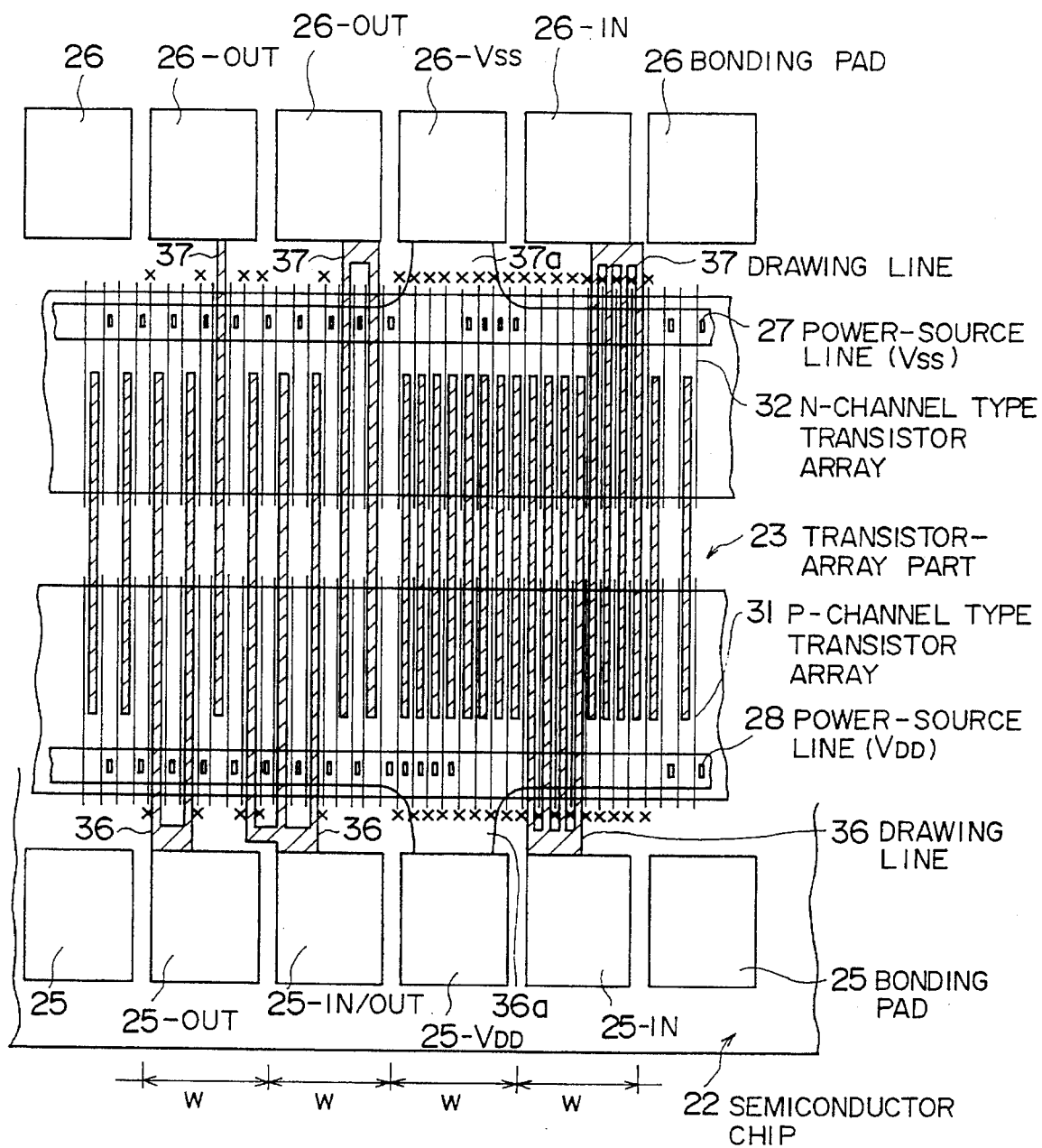
FIG. 5 shows a detail illustration of an I/O-circuit part of a semiconductor device according to the present invention.
Figure 6:
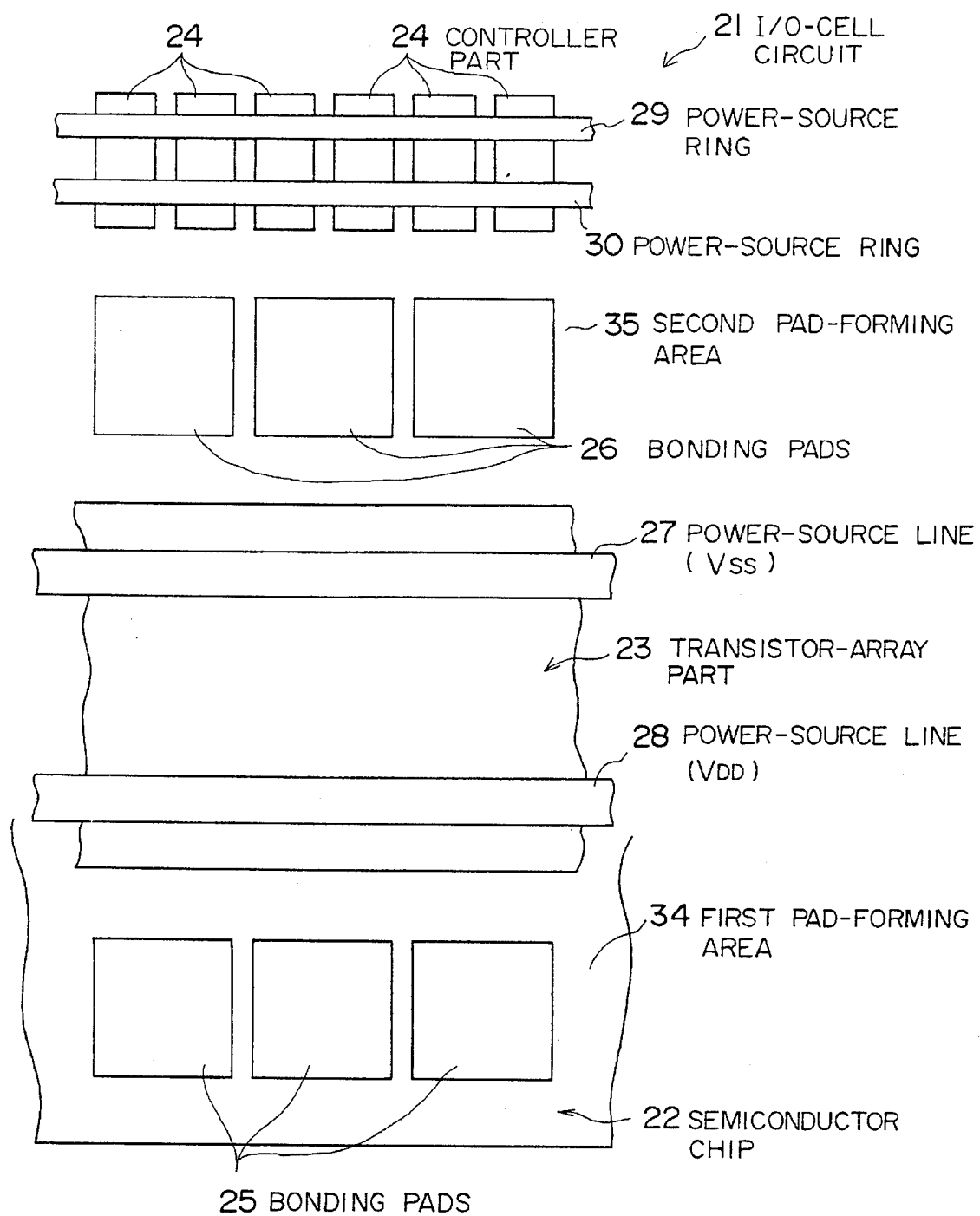
FIG. 6 shows a pattern layout of the I/O-circuit part of the semiconductor device.
Figure 7:
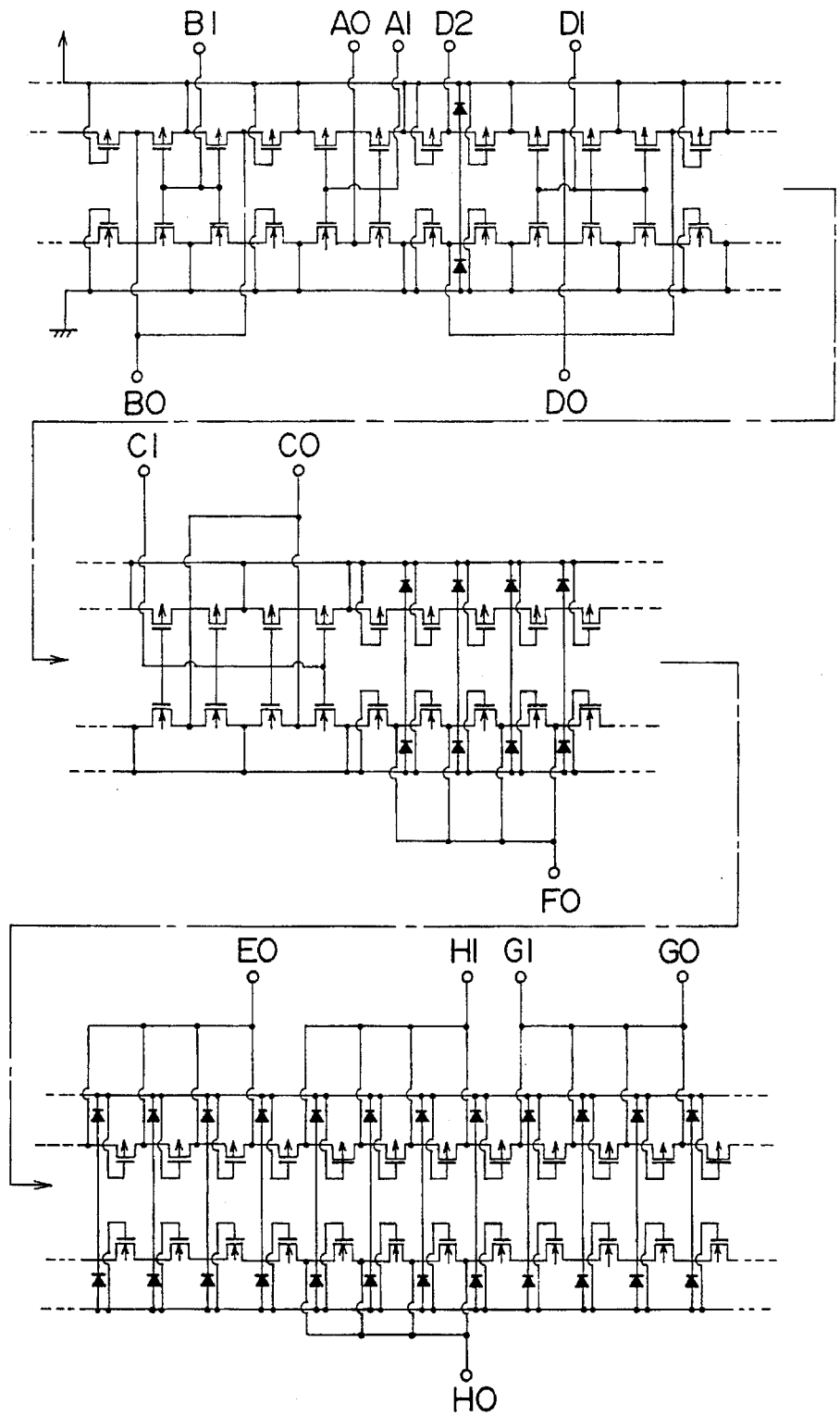
FIG. 7 shows a schematic diagram of a transistor-array part of the semiconductor device shown in FIG. 6.

First, a description will be given of a first embodiment of a semiconductor device 20 according to the present invention, by referring to FIGS. 5 to 7. An overall configuration of the semiconductor device 20 is almost the same as that shown in FIG. 1, which has already been described above. Features of the invention exist in an I/O-circuit part, and thus expanded illustrations of only the I/O-circuit part are represented in FIGS. 5 and 6. FIG. 5 shows a detail illustration of the I/O-circuit part of the semiconductor device 20 according to the present invention. FIG. 6 shows a pattern layout of the I/O-circuit part of the semiconductor device 20. And FIG. 7 shows a schematic diagram of a transistor-array part of the semiconductor device 20 shown in FIG. 6.

A description will be given of a layout of an I/O-cell circuit 21 by referring to FIG. 6. The I/O-cell circuit 21 is constructed such that a transistor-array part 23, a controller part 24, bonding pads 25, 26 (a first and a second groups of bonding pads), power-source lines 27, 28 (first power-source lines), and power-source rings 29, 30 (second power-source lines), etc., are formed in a semiconductor chip 22.

Figure 1:
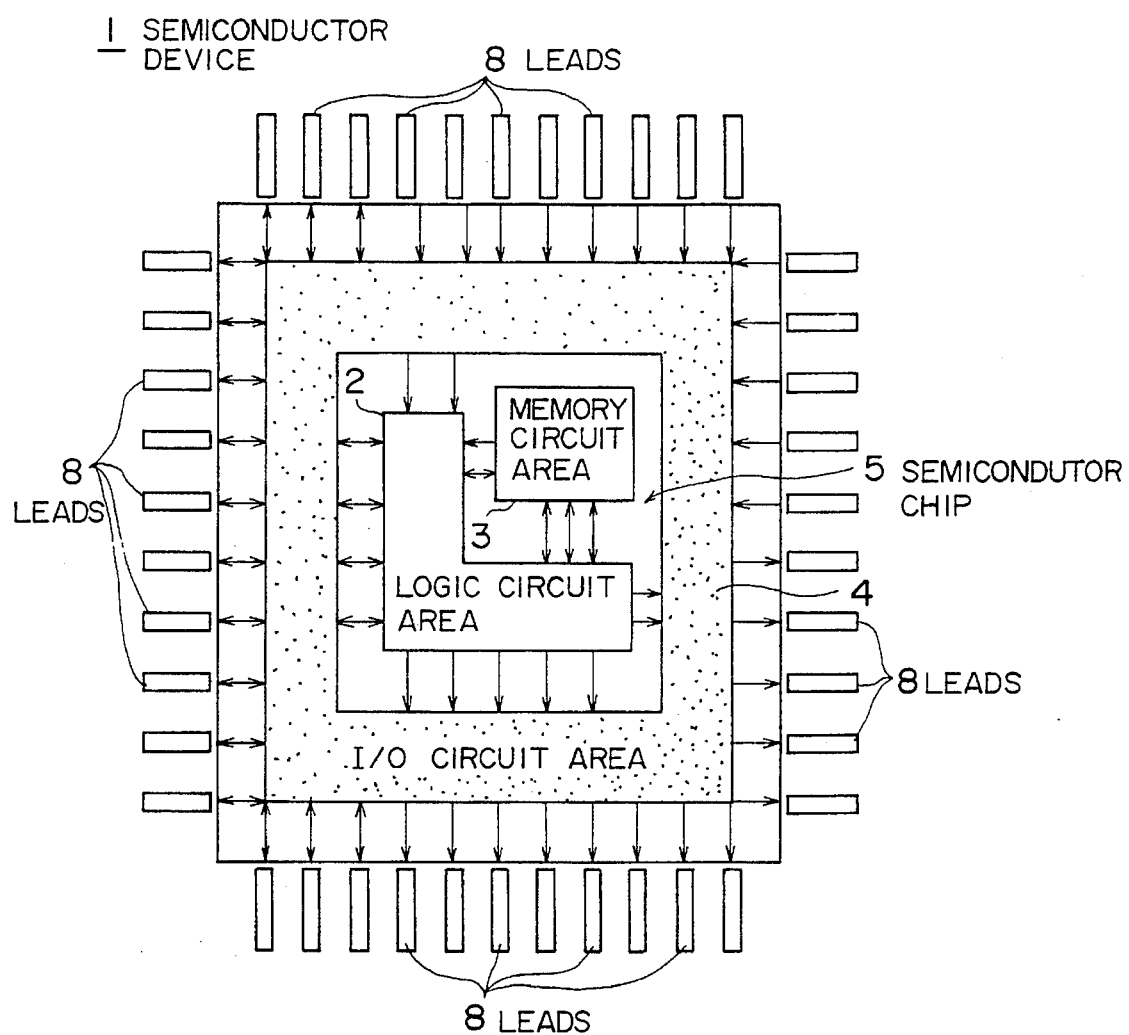
FIG. 1 shows an overall configuration of a conventional semiconductor device.

On the semiconductor chip 22 which is made of, for example, a silicon substrate, a logic circuit and a memory circuit, etc., are formed in addition to the I/O-cell circuit 21, as shown in FIG. 1. The I/O-cell circuit 21 is arranged near sides of the semiconductor chip 22.

Figure 2:
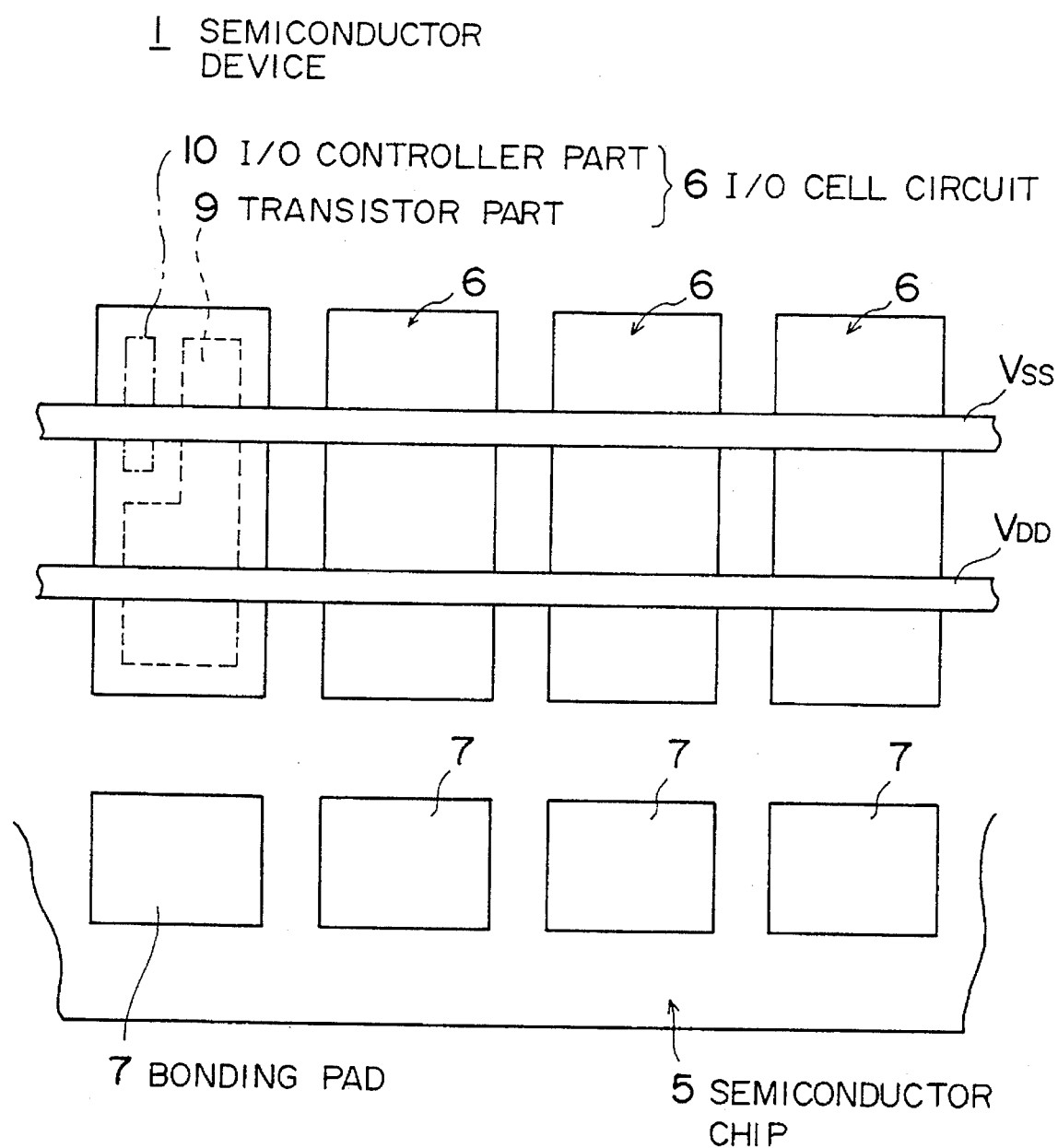
FIG. 2 shows a schematic configuration of areas (I/O circuit area) where I/O circuits of the conventional semiconductor device are installed.
Figure 3:
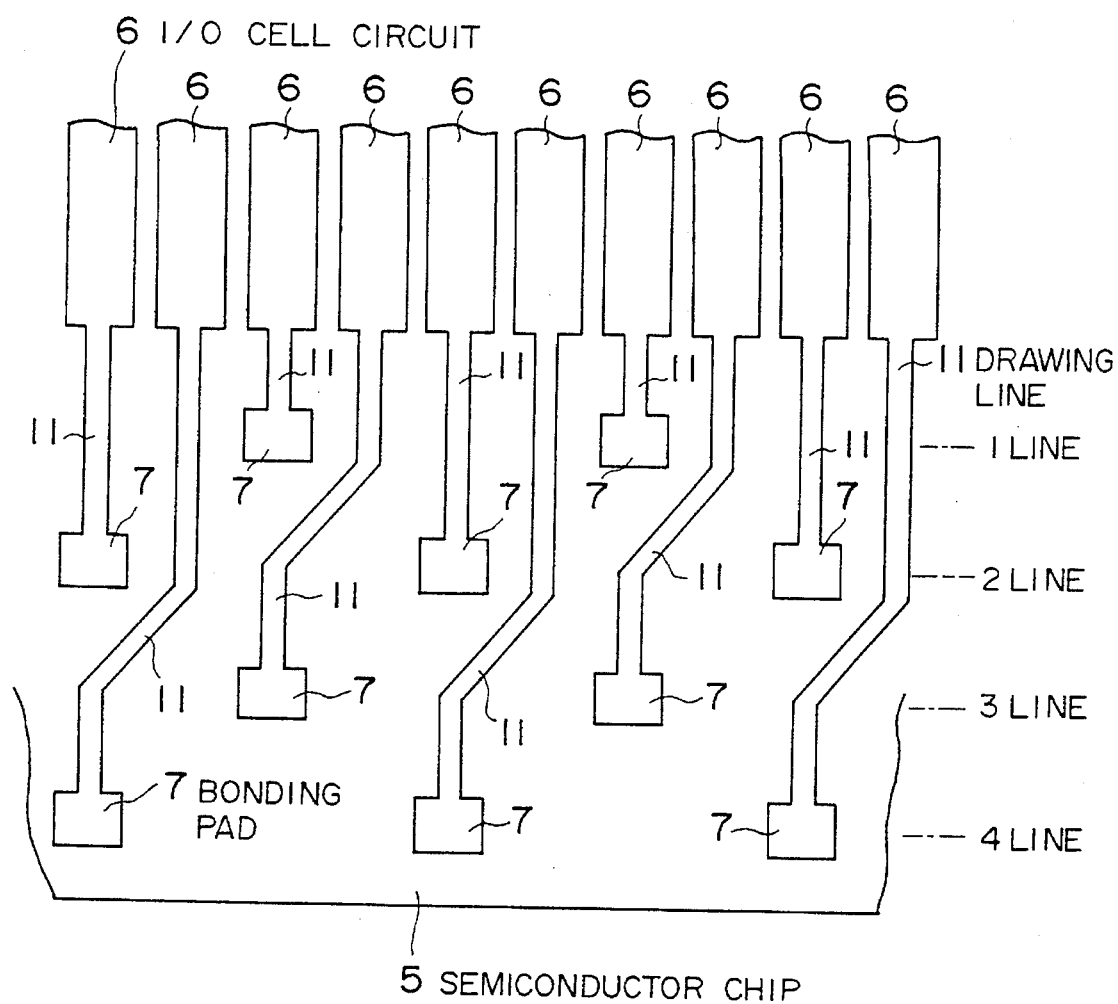
FIG. 3 shows a modified configuration of I/O cell circuits and bonding pads, where the bonding pads are arranged in a plural number of lines outside the I/O cell circuits.

As shown in FIG. 6, the transistor-array part 23 and the controller part 24 are separately formed in the I/O-cell circuit 21, though the transistor part 9 and the controller part 10 are integrated in the conventional I/O-cell circuit 6 shown in FIG. 2. The transistor-array part 23 is arranged such that a large number of transistors are formed in a form of an array. Near a side of the semiconductor chip 22 (bottom side of FIGS. 5 and 6), a P-channel type transistor array 31 is arranged, while at an inner part of the semiconductor chip 22, an N-channel type transistor array 32 is arranged. This transistor-array part 23 performs an amplifying process and a buffering process for an input signal based on a control signal coming from the controller part 24.

The controller part 24 is arranged at a given spaced-apart location toward an inner direction from a region of the transistor-array part 23. The controller part 24 is connected with the transistor-array part 23 by control lines (not shown) which supply the control signal to each transistor of the transistor-array part 23.

As for the control lines, if the semiconductor chip 22 is constructed with a multi-layer form, an interconnection layer which is formed between layers may be available for the control lines. A technique for constructing the semiconductor chip 22 with the multi-layer form is generally used, and it is also easy to arrange the control lines as mentioned above. Further, if the control lines are constructed without a routing on a surface of the semiconductor chip 22, a line routing for the bonding pads 25, 26 may be easily performed.

As described above, the transistor-array part 23 is arranged separately from the controller part 24, and thus it is possible to individually design areas for forming the transistor-array part 23 and the controller part 24, so that this advantage makes layout on the semiconductor chip 22 easy. In other words, in the conventional configuration in which the transistor part 9 and the controller part 10 are integrated in the I/O-cell circuit 6, the I/O-cell circuit 6 has to be dealt with as a single unit for designing internal circuits, so that there is little flexibility for a layout design, and there are some unused spaces. On the contrary, in the configuration according to this invention, because the transistor-array part 23 is separated from the controller part 24, the flexibility for the layout design is increased, and it can prevent the unused spaces from occurring on the semiconductor chip 22. These advantages leads to miniaturization of the semiconductor device 20.

In FIG. 6, a power-source line 27 (one of the first power-source lines) is a power-source bus line $V_{SS}$ which is formed on the transistor-array part 23, and a power-source line 28 (one of the first power-source lines) is a power-source bus line $V_{DD}$ which also is formed on the transistor-array part 23. The power-source line 27 supplies a power source to the N-channel type transistor array 32, and the power-source line 28 supplies the power source to the P-channel type transistor array 31. Each of the power-source lines 27, 28 is arranged along with the transistor-array part 23 (to a horizontal direction of FIG. 6).

The power-source rings 29, 30 (the second power-source lines) are arranged on the controller part 24, and supply the power source to the controller part 24. The power-source ring 29 is connected to the power-source bus line $V_{SS}$, and the power-source ring 30 is connected to the power-source bus line $V_{DD}$. As mentioned above, the power-source lines 27, 28 for supplying the power source to the transistor-array part 23 and the power-source rings 29, 30 for supplying the power source to the controller part 24 are individually formed. Therefore, it is possible to design an arrangement of the lines 27 to 30 for supplying the power source with a sufficient flexibility for the layout. This advantage makes a routing of complicated lines unnecessary, and achieves an easy layout design.

Next, a description will be given of a layout of the bonding pads 25, 26.

Figure 9:
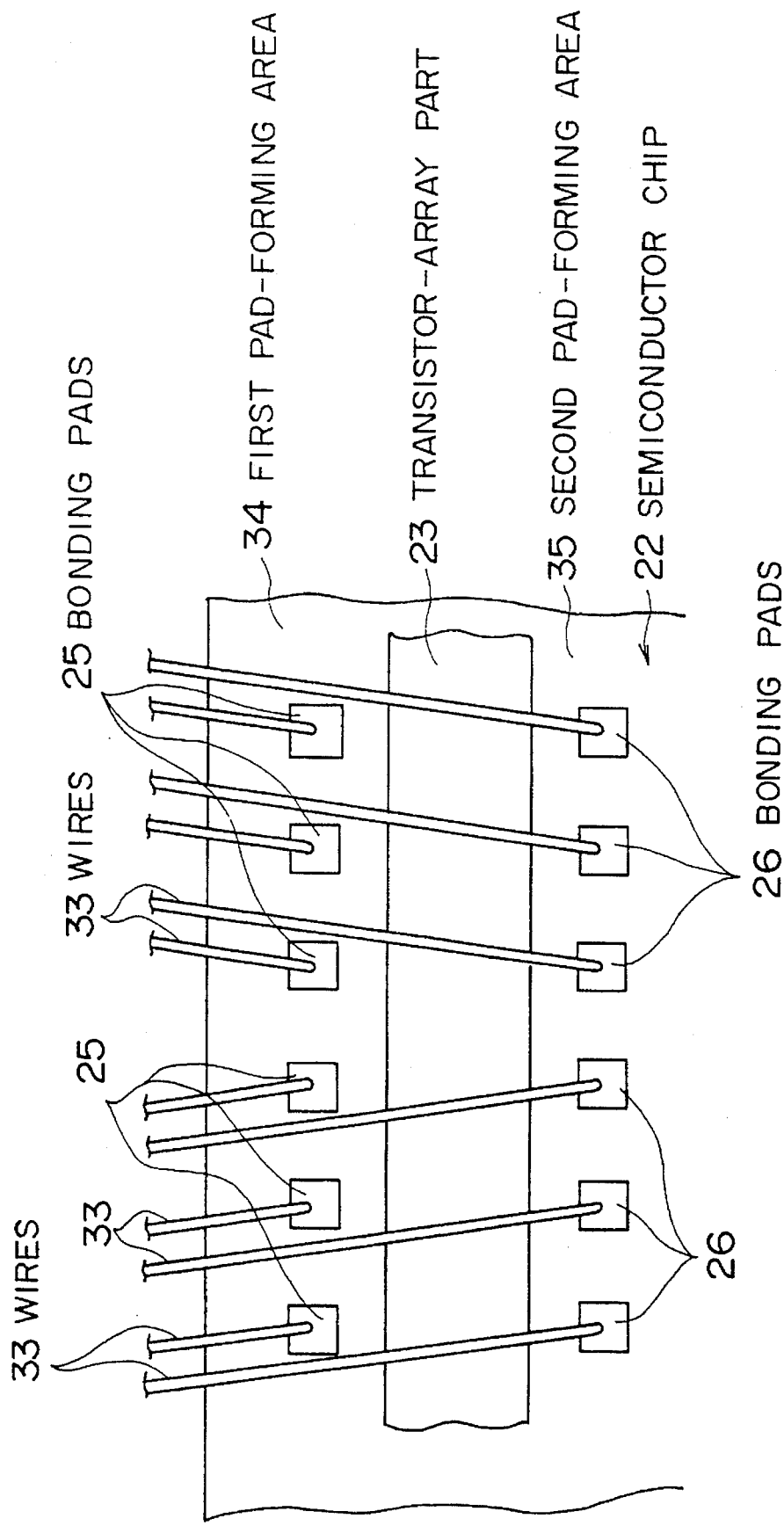
FIG. 9 shows a connecting configuration between bonding pads and wires.

As shown in FIG. 9, the bonding pads 25, 26 are components which are to be connected with wires 33, by which the bonding pads 25, 26 may be electrically connected to the leads 8 (shown in FIG. 1). To ensure bonding between the bonding pads 25, 26 and the wires 33, areas of the bonding pads 25, 26 are required to be at least a given area. Therefore, for miniaturizing the semiconductor device 20, reducing the areas of the bonding pads 25, 26 must be restricted.

On the other hand, according to a high-density integration of the semiconductor device 20, a number of the leads tends to be increased. Therefore, a number of the bonding pads 25, 26, which are formed on the semiconductor chip 22, also tends to be increased. Thus, it is important for miniaturizing the semiconductor device 20 to efficiently form the bonding pads 25, 26 on the semiconductor chip 22.

In this embodiment, when the bonding pads 25, 26 are formed on the semiconductor chip 22, a first line of the bonding pads 25 (the first group of bonding pads) is formed in a first pad-forming area 34 which is formed along an outer side of the transistor-array part 23, and a residual second line of the bonding pads 26 (the second group of bonding pads) is formed in a second pad-forming area 35 which is formed along an inner side of the transistor-array part 23. A sum of a number of the first line of the bonding pads 25 and a number of the second line of the bonding pads 26 is a total number of the bonding pads necessary for the semiconductor device 20.

As described above, the first line of the bonding pads 25 and the second line of the bonding pads 26 are formed along opposite sides of the transistor-array part 23. In this situation, when the number of the bonding pads 25, 26 are increased, with respect to the first line of the bonding pads 25, its layout arrangement is designed in the first pad-forming area 34, and with respect to the second line of the bonding pads 26, its layout arrangement is designed in the second pad-forming ares 35. Such individual design of the bonding pads makes the layout easy. On the contrary, the conventional configuration, in which all bonding pads are formed in only the first pad-forming area, makes the layout difficult. Further, in the new configuration according to the invention, an inter-pad pitch of the bonding pads 25, 26 may be extended further than for the conventional configuration.

From these advantages, a flexibility may be improved of a routing of drawing lines 36, 37 (shown in FIG. 5) which are arranged between the transistor-array part 23 and the respective bonding pads 25, 26. Therefore, the transistor-array part 23 may be connected with each of the bonding pads 25, 26 via a short-routing line. Thus, the semiconductor device 20 may be miniaturized by shortening the drawing lines 36, 37, and impedances of the drawing lines 36, 37 may be reduced, which lead to preventing losses from occurring in a signal transmission and a power supply.

Next, a description will be given of the configuration of the transistor-array part 23, by referring to FIGS. 5 and 7.

As mentioned above, the transistor-array part 23 consists of the P-channel type transistor array 31 and the N-channel type transistor array 32. In particular, each of the transistor arrays 31, 32 is constructed such that a large number of transistors are formed in sequence in a form of the array, as shown in FIG. 7. And each of the bonding pads 25, 26, which are formed along either side of the transistor-array part 23, is connected to a given location of the transistor-array part 23.

In FIG. 5, the bonding pads 25, 26 include input bonding pads 25-IN, 26-IN, output bonding pads 25-OUT, 26-OUT, and power-source bonding pads 25-$V_{DD}$, 26-$V_{SS}$. And components shown with hatch marks in FIG. 5 are routing lines for connecting between each of the bonding pads 25, 26, the P-channel type transistor array 31, and the N-channel type transistor array 32.

In this embodiment, the transistor-array part 23 is divided into a plurality of driving areas, and each driving area is determined based on a value of a driving current necessary for performing a given input-and-output processing for signals which are input and output to/from the bonding pads 25, 26. Namely, for example, if a signal level is small, an amplifying process with a large gain is necessary for inputting or outputting the signal to/from the logic circuits of the semiconductor device 20. The above represents a necessity of a large driving current. Therefore, in a bonding pad which is supplied with such a small-level signal, a wider driving area should be prepared for a transistor area to obtain the large driving current. Whereas, if the signal level is large, and the amplifying process with the large gain is unnecessary, a narrower driving area should be prepared for the transistor area.

For the plurality of the driving areas in the transistor-array part 23, the driving areas should be electrically isolated from each other. In this embodiment, this electrical isolation is performed by turning off a transistor which is located in a boundary part of the driving area. In FIG. 5, for the transistor which has been turned off, a "x" is marked at an end of the transistor gate.

In FIG. 5, a width represented by "W" indicates a width of the conventional I/O-cell circuit which is determined by a width of the bonding pad. It is found that a plurality of the driving areas are existing in the width of the bonding pads 25, 26.

In this way, the transistor-array part 23 is divided into plurality of the driving areas according to the values of the necessary driving current. Therefore, in such a configuration, unnecessary transistors may be extremely reduced compared with the conventional configuration in which a large number of transistors are formed so that the I/O-cell circuit could be adaptive to a maximum value of the driving current. This advantage achieves miniaturization of the transistor-array part 23, and also achieves miniaturization of the semiconductor device 20.

And, FIG. 7 shows a detail schematic diagram of the transistor-array part 23 shown in FIG. 5. In FIG. 7, ports A0 to C0 are output ports which are connected with the output-bonding pads 25-OUT, 26-OUT, a port D0 is an input/output port which is connected with the input/output-bonding pad 25-IN,OUT, ports G0, H0 are input ports which are connected with the input-bonding pads 25-IN, 26-IN, and ports E0, F0 are power-source ports which are connected with the power-source bonding pads $25\text{-}V_{DD}$, $26\text{-}V_{SS}$. In addition, ports A1 to D1 are control ports which are connected with the controller part 24. Ports D2, G1, H1 are input-signal ports from the bonding pads.

In FIG. 7, in each part comprising a diode, gates of both side transistors on either side of the diode are supplied with a given voltage to be turned off. By the transistors which are turned off, transistor groups (driving areas) are electrically isolated from each other. Thus, by turning off the unnecessary transistors which are formed between the adjacent driving areas, the transistor-array part 23 can be divided into the plurality of the driving areas. In other words, the driving area can be easily allocated into the plurality of the driving areas with no specific configuration, but only by electrically switching the transistors. And even if a useless driving area is unavoidably generated by an application in the transistor array, the useless driving area may be effectively used for forming diodes which prevent the transistors from being destroyed due to static electricity (ESD-protecting diode).

FIG. 8 shows an extended illustration of a connecting configuration between the power-source-bonding pads $25\text{-}V_{DD}$, $26\text{-}V_{SS}$, and the power-source lines 27, 28. The power-source lines 27, 28 are arranged on the transistor-array part 23 along side the arranged lines of the bonding pads 25, 26. The bonding pads 25 are located on an outer side of the power-source line 28, and the bonding pads 26 are located 9 on an inner side of the power-source line 27. Therefore, the power-source-bonding pad $25\text{-}V_{DD}$, which is one of the bonding pads 25, is also located close to the power-source line 28, and the power-source-bonding pad $26\text{-}V_{SS}$, which is one of the bonding pads 26, is located close to the power-source line 27. The power-source-bonding pad $25\text{-}V_{DD}$ is connected with the power-source line 28 through a drawing line 36a, and the power-source-bonding pad $26\text{-}V_{SS}$ is connected with the power-source line 27 through a drawing line 37a.

Figure 4:
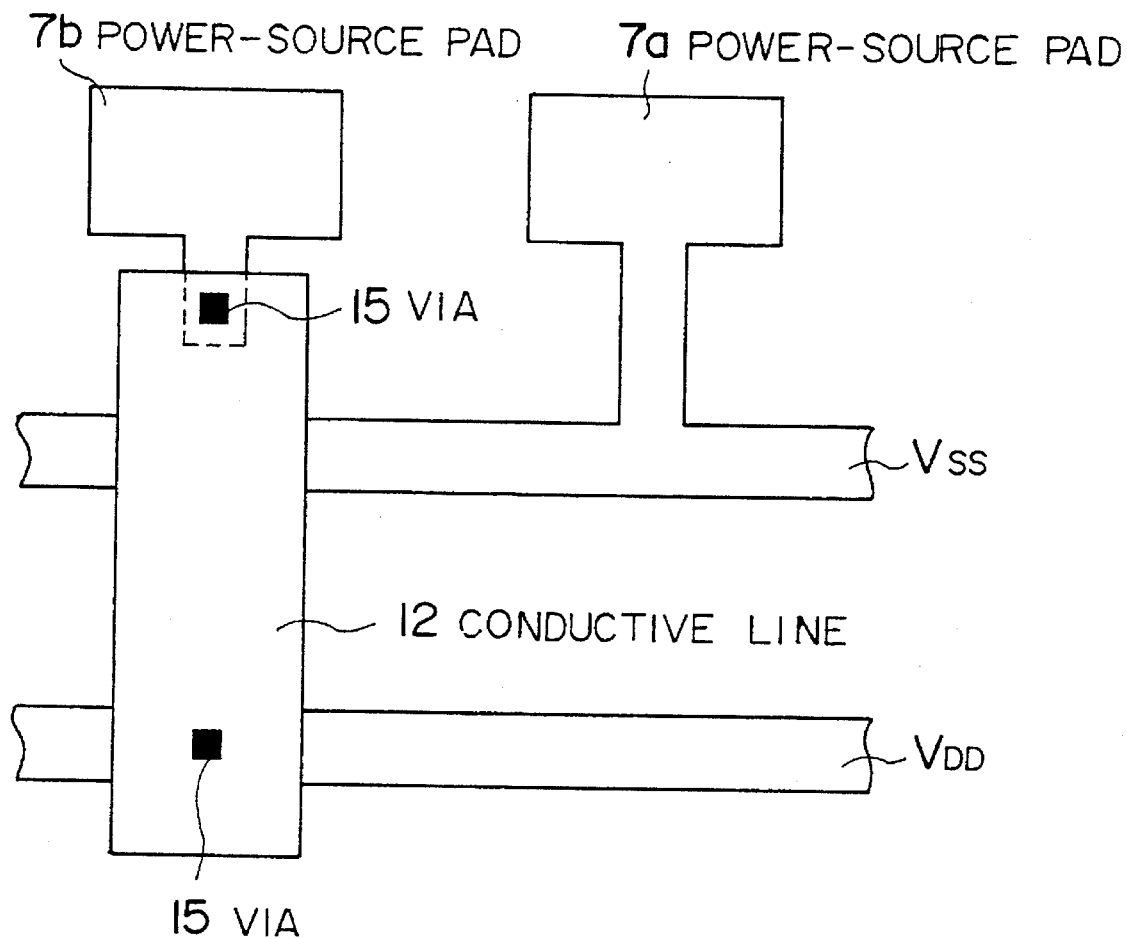
FIG. 4 shows a conventional connecting configuration between power-source pads and power-source lines $V_{DD}$, $V_{SS}$.

In such a configuration, there is no need for connecting a power-source line across another power-source line, so that this enables a connection with a shorter routing line. Therefore, impedances of the drawing lines 36a, 37a, connecting the power-source lines 27, 28 with the power-source-bonding pads $25\text{-}V_{DD}$, $26\text{-}V_{SS}$, may be reduced. Thus, the above achieves reduction of a voltage drop generated across the drawing lines 36a, 37a. Therefore, this configuration may reduce loss of the power-source supply compared with the conventional configuration in which the vias 14, 15 are used (shown in FIG. 4), and may achieve an extremely increased power-consumption reduction.

Figure 10:
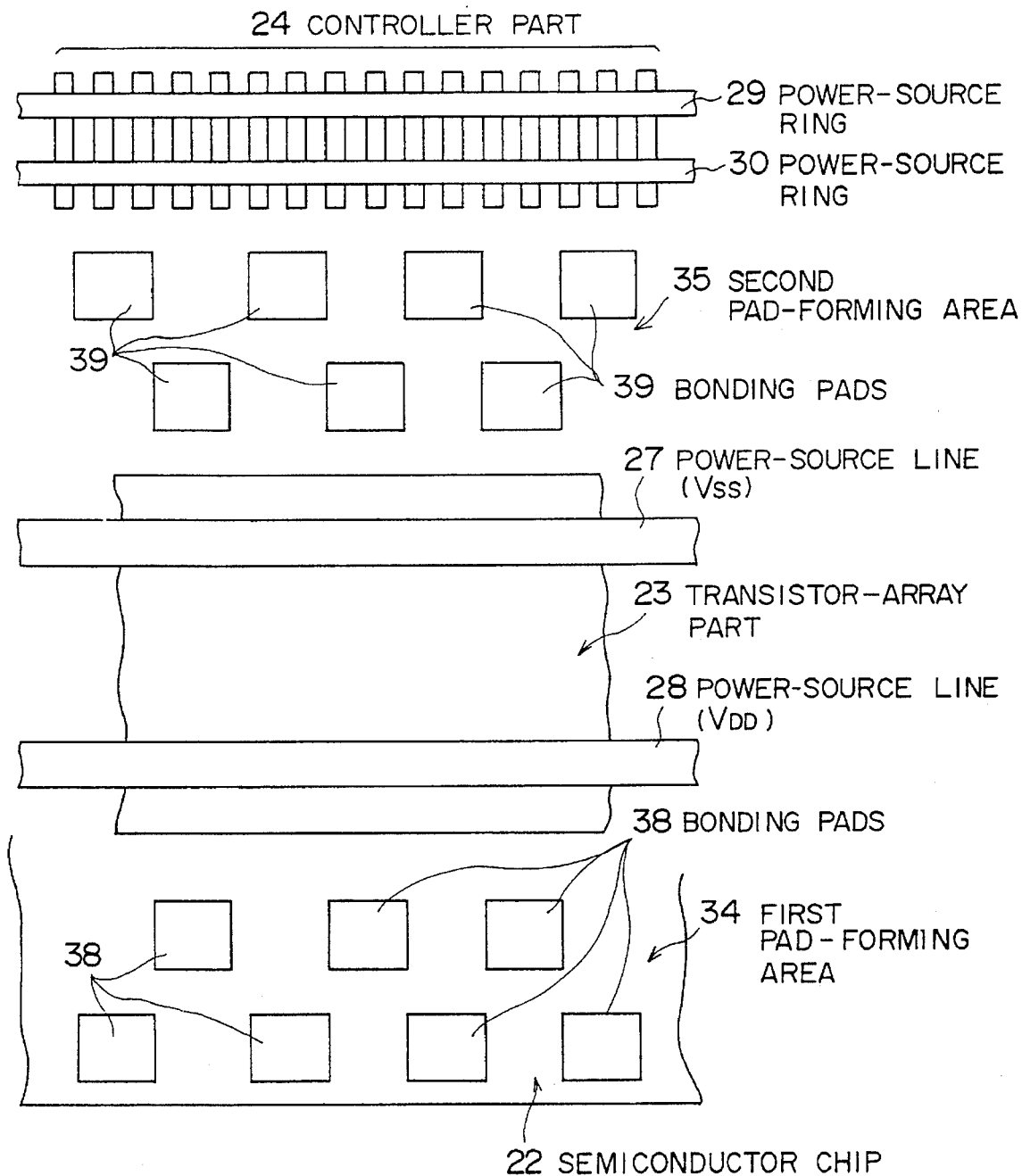
FIG. 10 shows a modified configuration of the semiconductor device according to the present invention shown in FIG. 5, in which each bonding pad is arranged in a form of two lines.

As shown in FIGS. 5, 6, the above embodiment is described with one example of the configuration such that the bonding pads 25, 26 are arranged in a form of 2 lines on opposite sides of the transistor-array part 23. In such a configuration, if a number of the bonding pads is increased according to an increase in a number of leads implemented in the semiconductor device, the bonding pads 38, 39 may be respectively arranged in a form of plural lines on both of the opposite sides of the transistor-array part 23, as shown in FIG. 10. FIG. 10 shows a modified configuration of the semiconductor device according to the present invention shown in FIG. 5, in which the bonding pads are arranged in a form of two lines.

In FIGS. 5, 10, the bonding pads are arranged along both of the opposite sides of the transistor-array part 23. This allows first and second pad-forming areas 34, 35 to occupy a wider area, respectively, than the conventional configuration. Therefore, even if each of the bonding pads 38, 39 is arranged in respective pad-forming areas 34, 35 in a form of plural lines, a pitch for arranging the bonding pads remains with a wide interval length. Thus, it is easy to design a routing of the drawing lines, and it is possible to design thick drawing lines, which may prevent the impedance from decreasing.

Further, it is possible to form a portion of the power-source lines at a location further towards the inside of the semiconductor chip than a location of the bonding pads 26 which is on the inner side of the transistor-array part 23. In this configuration, power-source pads on the semiconductor chip can be connected to the power-source lines with shorter lines without vias. This configuration may also prevent the impedance in a connection part between the power-source line and the power-source bonding pad from increasing, and the loss of the power-source supply may be reduced.

As described above, the present invention has the following features.

First, the bonding pads are arranged in the form of two lines along opposite side of the transistor-array part. Therefore, even if the number of the bonding pads is increased, the layout of the bonding pads can be easily performed. And the inter-pad pitch of the bonding pads may be extended further than in the conventional configuration in which the bonding pads are arranged in the form of the single line outside the I/O-cell circuits.

Thus, the drawing lines between the transistor-array part and the bonding pads may be routed with a sufficient flexibility, so that the transistor-array part can be connected with the bonding pads by using shorter and thicker routing lines as the drawing lines. A size of the semiconductor device may be reduced by an amount of shortening of the drawing lines. And the shorter and thicker drawing lines enable the impedance of the routing lines between the transistor-array part and the bonding pads to be decreased, and can prevent generation of loss in the signal transmission and the power supply.

Second, the individual design of the transistor-array part and the controller part is allowed, and this enables the efficient layout for forming these parts. Thus, the unused space on the semiconductor chip may be reduced, and this advantage leads to miniaturization of the semiconductor device.

Third, in this semiconductor device, there is no need for routing the lines around from the single power-source line to the transistor-array part and the controller part. This configuration also enables an efficient layout for forming the power-source lines. Thus the unused space on the semiconductor chip may be reduced, and this advantage also leads to miniaturization of the semiconductor device.

Fourth, in this semiconductor device, the transistor-array part is allocated into the plurality of driving areas based on the necessary value of the driving current. However, in the conventional configuration, the I/O-cell circuit is formed for each bonding pad, so as to be adaptive to a maximum value of the driving current. Therefore, the new configuration according to the invention may extremely reduce useless transistors, and enables the transistor-array part to be a small size. Such a small-sized transistor-array part also enables the miniaturization of the semiconductor device.

Fifth, in this semiconductor device, the transistor-array part can be easily allocated into the plurality of the driving areas with no specific configuration, but only by electrically switching the transistors.

Sixth, in this semiconductor device, two power-source lines are formed on the transistor-array part along the direction of the lines forming the bonding pads, each of the two power-source lines being connected with the power-source bonding pad close to its power-source line. Therefore, the power-source line can be connected with the power-source bonding pad without crossing the other power-source line, so that this may prevent impedance in the connection part between the power-source line and the power-source bonding pad from increasing, and may also prevent generation of loss in the power-source supply.

Seventh, in this semiconductor device, the portion of the power-source line is located further towards the inside of the semiconductor chip than the location of the bonding pads which are located on the inner side of the transistor-array part. In this configuration, power-source pads on the semiconductor chip can be connected to the power-source lines with shorter lines without vias. This configuration may also prevent the impedance in the connection part between the power-source line and the power-source bonding pad from increasing, and the loss of the power-source supply may be reduced.

Further, the present invention is not limited to these embodiments, but various variations and modifications may be made without departing from the scope of the present invention.

What is claimed is:

1. A semiconductor device comprising:

a semiconductor chip;

an I/O-cell circuit in said semiconductor chip, for supplying input and output signals to and from the semiconductor chip, said circuit including a transistor-array part;

a first group of bonding I/O pads for supplying said input and output signals, which are connected with said I/O-cell circuit and are formed in a first pad-forming area arranged along a first side of said transistor-array part, said first side facing toward an outside of the semiconductor chip; and a second group of bonding I/O pads for supplying said input and output signals, which are connected with said I/O-cell circuit and are formed in a second pad-forming area along a second side of said transistor-array part, said second side facing toward an inside of the semiconductor chip.

2. The semiconductor device as claimed in claim 1, wherein said I/O-cell circuit further includes a controller part which is separated from said transistor-array part on said semiconductor chip.

3. The semiconductor device as claimed in claim 2, wherein the semiconductor device further comprises:

first power-source lines for supplying a first power source to said transistor-array part; and second power-source lines for supplying a second power source to said controller part;

wherein said first power-source lines and said second power-source lines are independently arranged.

4. The semiconductor device as claimed in claim 1, wherein said transistor-array part comprises a plurality of array parts having different values of driving currents for driving said input and output signals.

5. The semiconductor device as claimed in claim 4, wherein said plurality of array parts is formed by means of generating isolation between said array parts by turning off transistors in a boundary of the array parts.

6. The semiconductor device as claimed in claim 1, wherein said semiconductor device further comprises two power-source lines which are formed on said transistor-array part along a direction of lines formed by one of said first and said second group of bonding I/O pads, each of the two power-source lines being connected with a power-source bonding pad of the bonding pads close to its power-source line.

7. The semiconductor device as claimed in claim 6, wherein a portion of said power-source line is located further towards the inside of the semiconductor chip than a position of said second group of bonding I/O pads which are located along said other side of said transistor-array part.

* * * * *